United States Patent [19]

Akutagawa

[11] Patent Number: 4,967,229
[45] Date of Patent: Oct. 30, 1990

[54] PROCESS FOR FORMING DICING LINES ON WAFER

[75] Inventor: Satoshi Akutagawa, Kawasaki, Japan

[73] Assignee: Fujitsu Limited, Kawasaki, Japan

[21] Appl. No.: 333,414

[22] Filed: Apr. 5, 1989

[30] Foreign Application Priority Data

Apr. 12, 1988 [JP] Japan .................................. 63-88215

[51] Int. Cl.$^5$ ............................................ G03B 27/42
[52] U.S. Cl. ....................................... 355/53; 355/77; 437/226
[58] Field of Search ....................... 355/29, 53, 54, 86, 355/77; 437/226, 227

[56] References Cited

U.S. PATENT DOCUMENTS 4,542,397 9/1985 Biegelsen et al. ............... 437/226 X Primary Examiner—L. T. Hix
Assistant Examiner—D. Rutledge
Attorney, Agent, or Firm—Staas & Halsey

[57] ABSTRACT

A process for forming dicing lines on a wafer which comprises: exposing a wafer region in which a dicing line pattern has not been formed to light irradiated through and patterned by a reticle for forming dicing lines; the reticle having a nonpatterned region of the same size as a device pattern region of a reticle for forming a device pattern on the wafer and a dicing zone which is in contact with the periphery of the nonpatterned region.

3 Claims, 10 Drawing Sheets

PROCESS FOR FORMING DICING LINES ON WAFER

BACKGROUND OF THE INVENTION

1. Field of the Invention

The present invention relates to a process for forming dicing lines on a wafer, more particularly to a process for forming a dicing line pattern in a wafer region which has not been exposed to light during the formation of an LSI pattern of the wafer, by using a specific reticle for forming dicing lines or zones.

2. Description of the Related Art

In the production of semiconductor devices, reticles or masks are used for forming patterns of an electric circuit, etc., on a wafer by a projection exposure process, (i.e.) a photolithography process in which a pattern on the reticle or mask disposed not in contact with but above or apart from the wafer is projected and transferred onto the wafer surface by exposing the wafer to light irradiated through the reticle, whereby the wafer is patterned in a form defined by the patterns on the reticle and in a desired miniaturization, for example, 1/5 or 1/10. A device pattern formed on a reticle is stepwise repeatedly transferred onto the wafer surface by exposure to light in a "step-and-repeat" manner, and during this exposure, the dicing (or scribe) lines (or zones) are simultaneously transferred onto the wafer. The term "dicing lines" referred to herein means specific linear regions or zones used for dicing or dividing a wafer into individual chips.

FIG. 1 shows a plan view of a conventional reticle for forming an LSI pattern on a wafer, wherein a reticle 1 has a device pattern region 2 such as an electric circuit pattern (represented by an "F"-shaped pattern in the figure) formed in the central portion thereof and a dicing zone 3 having a predetermined width formed squarewise and in contact with the periphery of the device region 2. An alignment pattern 4 or the like is usually formed at a predetermined portion of the dicing zone 3, and a margin pattern 5 for protecting the alignment pattern 4 from exposure is formed at the portion corresponding to the alignment pattern 4. As shown in FIG. 2, the required patterns are formed shot by shot on a wafer by exposure to light in a manner such that patterns of the dicing zone 3 projected on the wafer are partially overlapped or subjected to duplicated or double exposure for each shot.

FIG. 3 shows another typical conventional reticle. In a reticle or mask 6, a dicing zone 3 is formed in a "L" shape and in contact with the periphery of a device pattern region 2 at the adjoining two sides thereof. By using this mask 6, the required patterns are formed on a wafer by shot-by-shot exposures to light in a manner such that the mask patterns projected on the wafer by respective exposures are not overlapped but are side by side and in contact with each other, as shown in FIG. 4.

Accordingly, upon exposure by using such reticles, the device pattern region and the dicing zone are simultaneously exposed so that the dicing zone 3 for dicing of a wafer by a dicer or dicing machine is also formed in contact with the periphery of the device pattern region 2 on the wafer.

Until recently, the LSI pattern formed on a reticle has been relatively smaller in size corresponding to a relatively smaller chip size, so that the whole surface of a wafer can be subjected to exposure to form dicing zones thereover. The chip size, however, is becoming larger and larger and some exposure apparatuses are now unable to effectively cover the circumferential region of a wafer. Also, the circumferential wafer region cannot be used essentially as an effective wafer region for providing sound chips due to unavoidable crystal defects which occur during the production and handling of wafer. Accordingly, the circumferential wafer region is not subjected to exposure and, in some instances, dicing lines are not completely formed in the circumferential region. Referring to FIG. 9, the pattern exposure is not carried out in the non-hatched region of a wafer 14, with the result that the aluminum layer for wiring, etc., is retained over the whole surface of the region. Therefore, when a reticle 1 of FIG. 1 having a square-shaped dicing zone 3 is used, the circumferential region cannot be subjected to a double exposure, with the result that a margin pattern 5 is retained. On the other hand, when a reticle 6 of FIG. 3 having an "L"-shaped dicing zone 3 is used, a region in which dicing lines are not formed is retained on one side of a wafer in accordance with the direction of a shot-by-shot exposure progress.

Also in the central device pattern region of a wafer, a region in which dicing line patterns are not formed is retained when an insertion pattern such as a monitor pattern is formed by using an insertion pattern reticle different from a device pattern reticle.

FIGS. 5A, 5B, and 5C show a device pattern reticle 51, and insertion pattern reticles 501 and 511, respectively, which all are the same size. The device pattern reticle 51 has a central device pattern region 52 (the pattern represented by "F,") and a dicing zone 53 in contact with the periphery of the device pattern region 52. The insertion pattern reticles 501 and 511 have respective insertion pattern regions 502 and 512 (the patterns represented by "x" and "y") which are smaller than the device pattern region 52 of the reticle 51, but have no dicing zone.

On a wafer partially shown in FIG. 6A, the device patterns "F," in the regions 62 and the dicing lines 63 are formed by using the reticle 51 in a stepand-repeat manner, during which the portion including regions 602, 603, and 612 is skipped, i.e., this portion is not subjected to exposure, and then the insertion patterns "x" and "y" are formed at sites 602 and 612, respectively.

In the above pattern formation processes, the region 603 between the regions 602 and 612 in which the insertion patterns "x" and "y" are formed is not subjected to exposure and the required dicing line is not formed for this region 603, as shown by imaginary broken lines.

In some cases, a margin pattern is retained in the central device pattern region of a wafer, as typically shown in FIG. 7A. The device patterns "F" in the regions 72 and the dicing lines 73 are formed by using the reticle 1 of FIG. 1 and an insertion pattern "x" of FIG. 5B, which is smaller than the device pattern "F", is formed at the site 702. During this formation process, a margin pattern 75 formed together with the pattern "F" of the left hand side region 72' is not subjected to exposure and is retained.

As mentioned above, regions in which dicing lines are not formed are retained in the circumferential region and, in some cases, the central device region of a wafer. The presence of such retained unexposed regions in which dicing lines are not formed or are incompletely formed causes a problem in that, upon dicing of a wafer into LSI chips, the retained unnecessary layer of aluminum, etc., damages the cutting edge of a dicing machine, and the aluminum dust, etc., is scattered and causes contamination of the wafer, the cut LSI chip products, and the dicing machine. The unnecessary pattern layers also cause dust during the later cleaning process, in which such layers may be exfoliated.

SUMMARY OF THE INVENTION

The object of the present invention is to provide a process for forming dicing lines on a wafer, which enables an efficient dicing of a wafer and prevents the formation of dust.

The object is achieved, according to the present invention, by a process for forming dicing lines on a wafer which comprises:

exposing a wafer region in which a dicing line pattern has not been formed to light irradiated through and patterned by a reticle for forming dicing lines, said reticle having a nonpatterned region of the same size as that of a device pattern region of a reticle for forming a device pattern on the wafer, and a dicing zone which is in contact with the periphery of the nonpatterned region.

Advantageously, according to the present invention, the circumferential region of the wafer, in which a dicing line pattern has not been formed, is exposed to light irradiated through and patterned by a reticle for forming dicing lines.

Also advantageously, according to the present invention, a region in which a dicing line pattern has not been formed during the forming of an insertion pattern in a device pattern region of a wafer by using an insertion pattern reticle different from a device pattern reticle, is exposed to light irradiated through and patterned by a reticle for forming dicing lines.

The present inventive process uses a reticle for forming dicing lines which has a nonpatterned region and a dicing zone which is in contact with the periphery of the nonpatterned region. The nonpatterned region and the dicing zone may be formed as black image and white image regions, respectively, or vice versa. The exposure using such a dicing line forming reticle enables the complete formation of the dicing lines in the circumferential region of a wafer and the region of the device pattern region in which a dicing line pattern has not been formed as described above, and enables the removal of unnecessary patterns formed and retained on the dicing line of a wafer, with the result that the dicing of a wafer into chips can be efficiently carried out without damage to a dicing machine or scattering dust.

DESCRIPTION OF THE PREFERRED EMBODIMENTS

Figure 8:
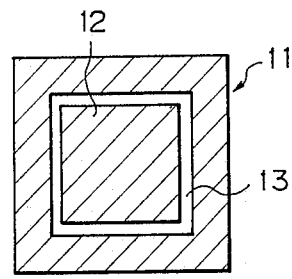
FIG. 8 shows a reticle for forming dicing lines according to the present invention, the reticle having a square-shaped dicing zone.

FIG. 8 is a plan view of a reticle for forming dicing lines according to the present invention. The dicing reticle 11 of FIG. 8 has a nonpatterned central black image region 12 which is the same size as a device pattern region of an LSI device pattern reticle and a square-shaped white image dicing zone 13 in contact with the periphery of the nonpatterned region 12 and having a predetermined width. The dicing zone 13 is the same size as the dicing zone of the LSI device pattern reticle, i.e., has a size sufficient to provide a passage for the cutting edge of a dicing machine during the dicing of a wafer.

A shot-by-shot exposure using the dicing reticle 11 enables dicing lines surrounding the device pattern regions to be formed on a wafer or the removal of any unnecessary pattern retained on a dicing line of the wafer.

Figure 9:
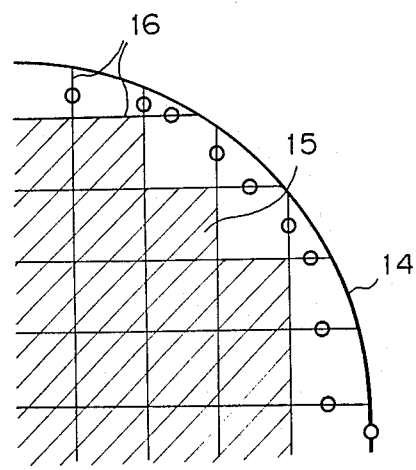
FIG. 9 shows a part of a wafer having the central device pattern; region, in which the device patterns and the corresponding dicing lines have been formed by using a conventional device pattern reticle such as shown in FIG. 1 with a square-shaped dicing zone, and the circumferential region, in which the dicing lines (marked with circles) have not been formed but are to be formed by using the reticle of FIG. 8 according to the present invention.

In FIG. 9, the circumferential region of a wafer is subjected to exposure for forming dicing lines according to the present invention. In the central device pattern region (shown with hatching) not in contact with the circular profile line of the wafer, the device patterns 15 are formed with the corresponding dicing lines positioned therebetween. In the circumferential region of the wafer, the dicing lines 16 designated circles are formed by an exposure using the dicing reticle 11. Accordingly, neither layers of an LSI nor other patterns are formed in the circumferential region, and thus the cutting edge of a dicing machine is not damaged when dicing a wafer into chips and dust scattering is prevented. Also, an unnecessary pattern will not be exfoliated during a later cleaning process or adhere as dust to the product devices.

Figure 10:
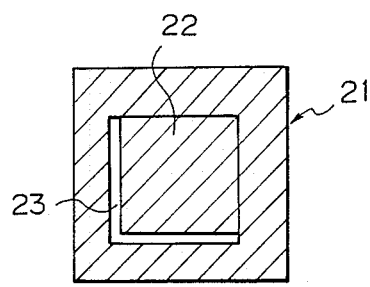
FIG. 10 shows another reticle for forming dicing lines according to the present invention, the reticle having an "L"-shaped dicing zone.

FIG. 10 is a plan view of a reticle for forming dicing lines according to the present invention. The dicing reticle 21 of FIG. 10 has a nonpatterned central black image region 22 which is the same size as a device pattern region of an LSI device pattern reticle and an "L"-shaped white image dicing zone 23 in contact with two adjoining sides of the nonpatterned region 22 and having a predetermined width. The dicing zone 23 is the same size as the dicing zone of the LSI device pattern reticle, i.e., is of a size sufficient to provide a passage for the cutting edge of a dicing machine during dicing of a wafer.

A shot-by-shot exposure using the dicing reticle 21 enables the dicing lines surrounding the device pattern regions to be formed on a wafer or the removal of an unnecessary pattern retained on a dicing line of a wafer.

Figure 11:
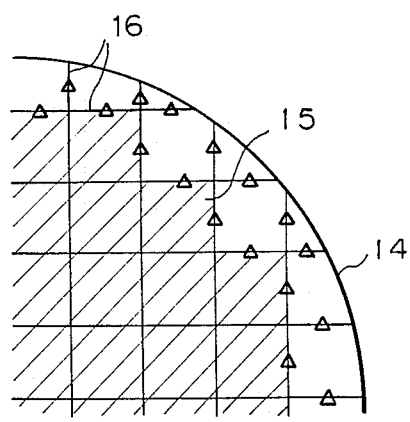
FIG. 11 shows a part of a wafer having the central device pattern region in which the device patterns and the corresponding dicing lines have been formed by using a conventional device pattern reticle such as shown in FIG. 3 with an "L"-shaped dicing zone, and the circumferential region in which the dicing lines (marked with triangles) have not been formed but will be formed by using the reticle of FIG. 10 according to the present invention.

In FIG. 11, the circumferential region of a wafer is subjected to exposure for forming dicing lines according to the present invention. In the central device pattern region (shown with hatching) not in contact with the circular profile line of the wafer, the device patterns 15 are formed with the corresponding dicing lines positioned therebetween. In the circumferential region of the wafer, the dicing lines 16 designated by triangles are formed by exposure using the dicing reticle 21. Accordingly, neither layers of an LSI nor other patterns are formed in the circumferential region, and thus the cutting edge of a dicing machine is not damaged when dicing a wafer into chips and dust scattering is prevented. Also, an unnecessary pattern will not be exfoliated during later cleaning process or adhere as dust to the product devices.

Figure 1:
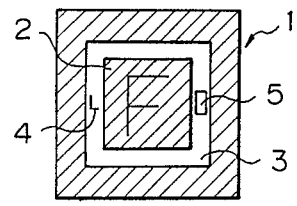
FIG. 1 is a plan view of a conventional device pattern reticle for forming device patterns on a wafer.
Figure 2:
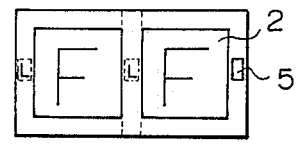
FIG. 2 shows two shots of the device pattern exposed onto the wafer surface by using the reticle of FIG. 1.
Figure 3:
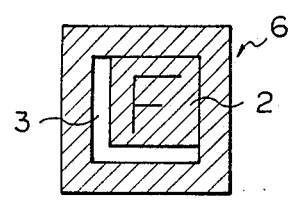
FIG. 3 shows another conventional device pattern reticle.
Figure 4:
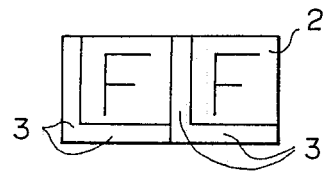
FIG. 4 shows two shots of the device pattern exposed onto the wafer surface by using the reticle of FIG. 3.
Figure 5A:
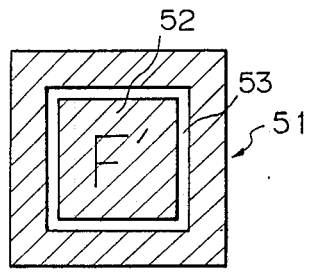
FIG. 5A shows another conventional device pattern reticle.
Figure 5B:
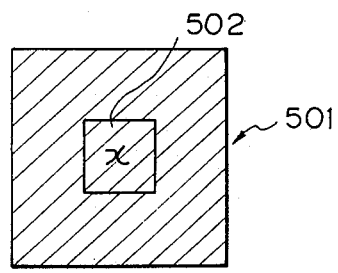
FIGS. 5B and 5C show reticles used for forming insertion patterns.
Figure 5C:
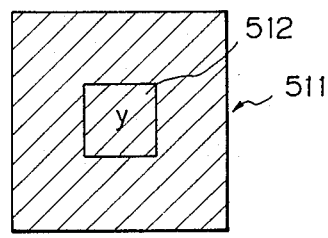
Figure 6A:
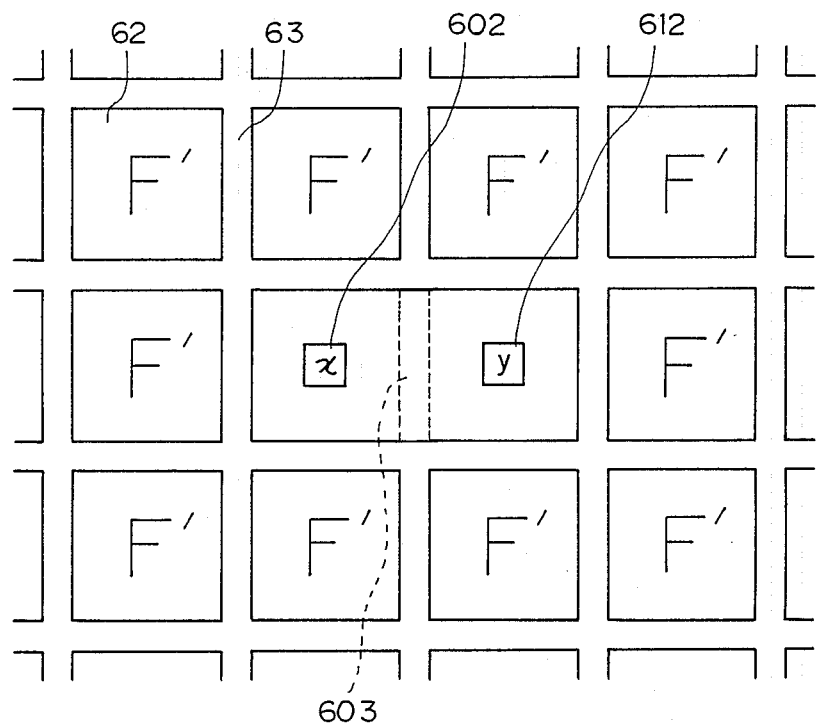
FIG. 6A shows twelve shots on a wafer, including ten shots of the device pattern "F," surrounding two shots of the insertion patterns "x" and "y", exposed onto the wafer surface by using the reticles of FIGS. 5A, 5B, and 5C, respectively.
Figure 6B:
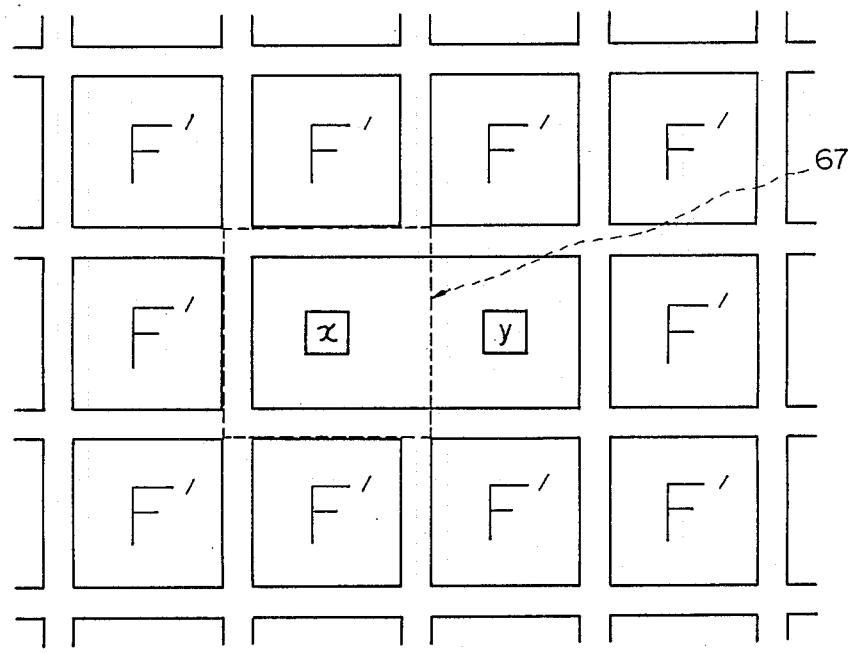
FIG. 6B shows the same shots as shown in FIG. 6A except that the region defined by broken lines represents the region which is subjected to exposure by using a reticle for forming dicing lines according to the present invention (the reticle is shown in FIG. 8)
Figure 6C:
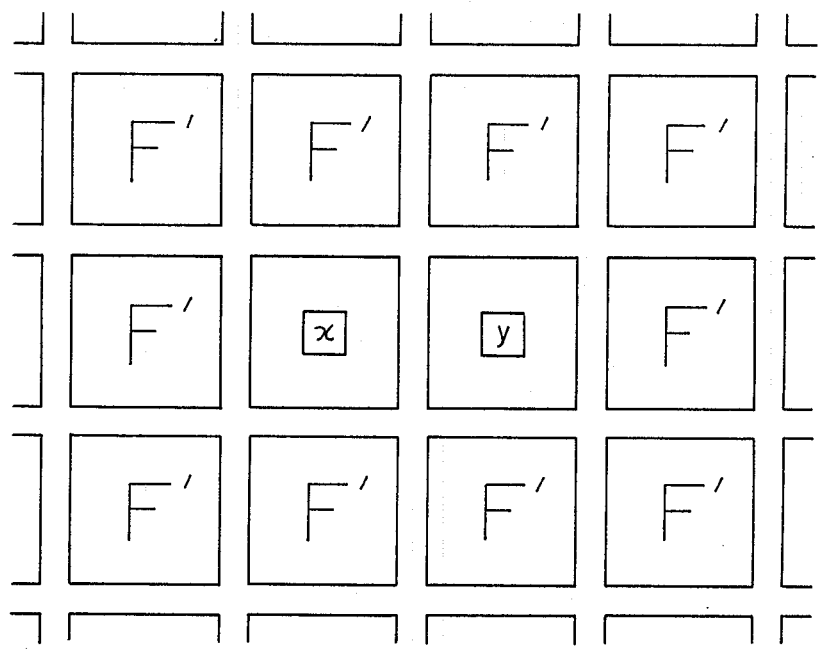
FIG. 6C shows the same shots as shown in FIGS. 6A and 6B, after the forming of a dicing line between the two insertion patterns "x" and "y", according to the present invention.

Referring to FIGS. 6B and 6C, the formation of a dicing line according to the present invention in the central device pattern region of wafer will be described. When a dicing line has not been formed between the two shots including the insertion patterns "x" and "y" as described herein with reference to FIG. 6A, one of such shots (67) shown by broken lines in FIG. 6B, for example, can be subjected to exposure by using a reticle 11 of FIG. 8 according to the present invention to form the required dicing line between these shots, as shown in FIG. 6C.

Figure 7A:
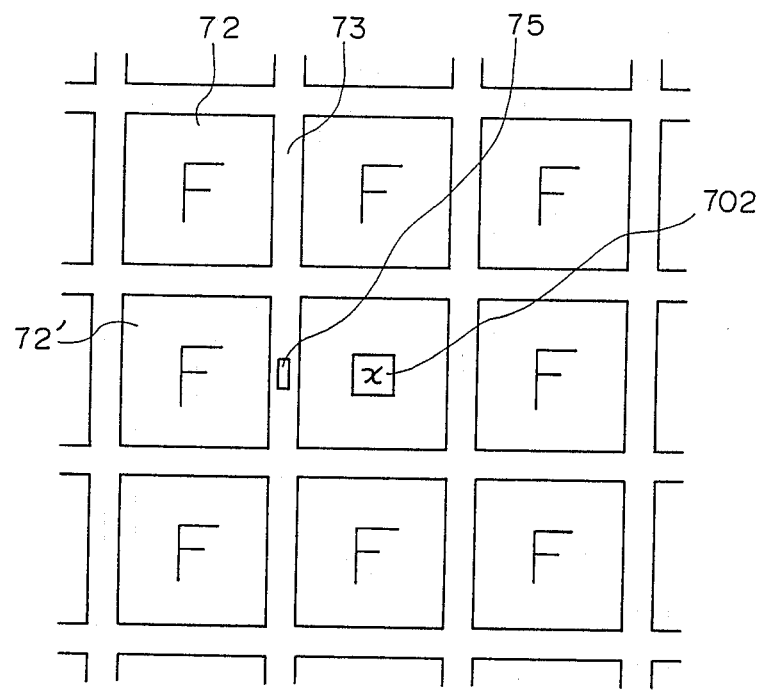
FIG. 7 shows nine shots on a wafer, including eight shots of the device pattern "F" surrounding one shot of the insertion pattern "x", exposed by using the device pattern reticle of FIG. 1 and the insertion pattern reticle of FIG. 5B.
FIG. 7B shows the same shots as shown in FIG. 7A except that the region defined by broken lines represents the region which is subjected to exposure by using a reticle for forming dicing lines according to the present invention (the reticle is shown in FIG. 8)
FIG. 7C shows the same shots as shown in FIGS. 7A and 7B, after removal of a margin pattern retained on a dicing line by using a reticle for forming dicing lines according to the present invention (the reticle is shown in FIG. 8)
Figure 7B:
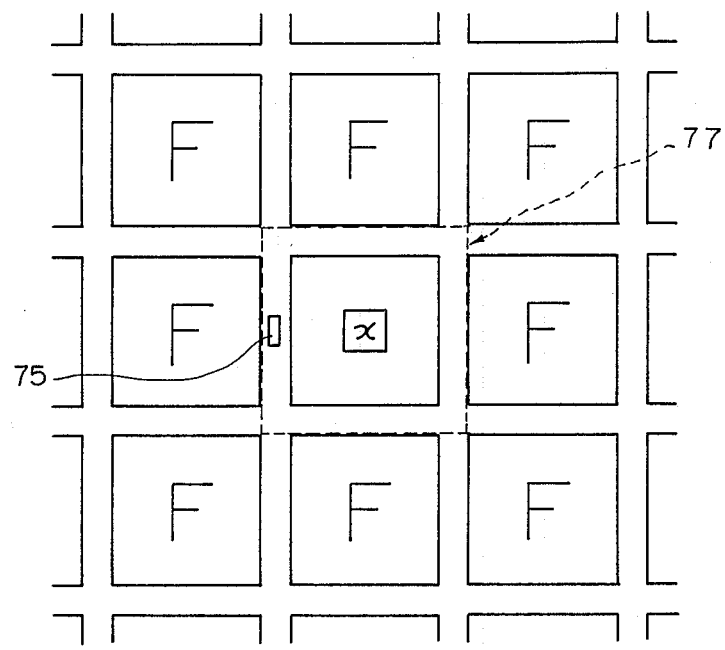
Figure 7C:
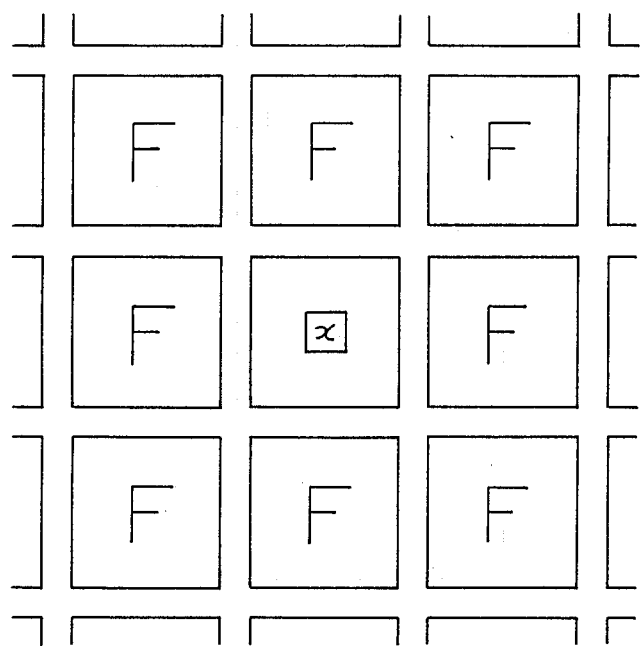

Referring to FIGS. 7B and 7C, the formation of a dicing line and removal of a retained margin pattern according to the present invention in the central device pattern region of wafer will be described. When a margin pattern is retained on a dicing line of a wafer left of a shot including the insertion pattern "x" as described previously with reference to FIG. 7A, the shot 77 shown by broken lines in FIG. 7B can be subjected to exposure by using a reticle 11 of FIG. 8 according to the present invention, to form the required dicing line and remove the retained margin pattern 75 as shown in FIG. 7C.

In the present invention, the dicing zones 13 and 23 of the dicing reticles 11 and 21 may be either black or white in accordance with the positive or negative photoresist layer on a wafer to be exposed.

The dicing zone 23 of the reticle 21 according to the present invention may be formed as an "L"-shaped pattern in contact with two adjoining sides of the nonpatterned region 22 in accordance with the direction of the step-and-repeat process.

As described above, upon the formation of LSI pattern on a wafer, the present invention enables the required dicing lines to be formed in the region in which dicing lines have not been formed, such as the circumferential region of a wafer or the central device pattern region of a wafer containing monitor patterns or other insertion patterns, and unnecessary patterns retained on dicing lines of a wafer to be removed, by an exposure using a reticle for forming dicing lines which has a white or black dicing zone and a black or white nonpatterned region surrounded by the dicing zone, with the result that the dicing of a wafer into chips can be efficiently carried out without damage to a dicing machine and scattering dust.

I claim:

1. A process for forming dicing lines on a wafer, which comprises:
exposing a wafer region, in which a dicing line pattern has not been formed, to light irradiated through and patterned by a reticle for forming dicing lines, said reticle having a nonpatterned region of the same size as a device pattern region of a separate reticle for forming a device pattern on the wafer and a dicing zone in contact with a periphery of the nonpatterned region.

2. A process according to claim 1, further comprising, as to the circumferential region of a wafer in which a dicing line pattern has not been formed, exposing the circumferential region of the wafer to light irradiated through and patterned by said reticle for forming dicing lines.

3. A process according to claim 1, further comprising, as to any part of a central region of the wafer in which a dicing line pattern has not been formed during forming of an insertion pattern in a device pattern region of the wafer by using an insertion pattern reticle different from a device pattern reticle, exposing each said part of said central region of the wafer to light irradiated through and patterned by said reticle for forming dicing lines.

* * * * *

UNITED STATES PATENT AND TRADEMARK OFFICE
CERTIFICATE OF CORRECTION

PATENT NO. : 4,967,229

DATED : Oct. 30, 1990

INVENTOR(S) : AKUTAGAWA

It is certified that error appears in the above-identified patent and that said Letters Patent is hereby corrected as shown below:

Col. 1,   line 17, change "(i.e.)" to --i.e.,--.

Col. 2,   line 42, change "stepand-repeat" to --step-and-repeat--.

Col. 4,   line 31, delete ";".

Signed and Sealed this

Fourth Day of August, 1992

*Attest:*

DOUGLAS B. COMER

*Attesting Officer*      *Acting Commissioner of Patents and Trademarks*